US010197611B2

(12) United States Patent
Biggs

(10) Patent No.: US 10,197,611 B2
(45) Date of Patent: Feb. 5, 2019

(54) SYSTEMS AND METHODS FOR TESTING ARM AND FIRE DEVICES

(71) Applicant: Raytheon Company, Waltham, MA (US)

(72) Inventor: Bradley M. Biggs, Corona, AZ (US)

(73) Assignee: Raytheon Company, Waltham, MA (US)

( * ) Notice: Subject to any disclaimer, the term of this patent is extended or adjusted under 35 U.S.C. 154(b) by 21 days.

(21) Appl. No.: 15/160,046

(22) Filed: May 20, 2016

(65) Prior Publication Data
US 2017/0336460 A1 Nov. 23, 2017

(51) Int. Cl.
*G01R 31/02* (2006.01)
*F42C 21/00* (2006.01)
*G01R 31/40* (2014.01)
*H02J 9/06* (2006.01)
*F42B 35/00* (2006.01)
*F42D 1/05* (2006.01)
*F41G 7/00* (2006.01)

(52) U.S. Cl.
CPC ........... *G01R 31/026* (2013.01); *F42B 35/00* (2013.01); *F42C 21/00* (2013.01); *F42D 1/05* (2013.01); *G01R 31/40* (2013.01); *H02J 9/061* (2013.01); *F41G 7/001* (2013.01); *F41G 7/007* (2013.01)

(58) Field of Classification Search
CPC ....... G01R 31/026; G01R 31/40; F42C 21/00; H02J 9/061
See application file for complete search history.

(56) References Cited

U.S. PATENT DOCUMENTS

| 6,295,932 B1* | 10/2001 | Kane, III | F42C 15/40 102/215 |
| 7,077,045 B2 | 7/2006 | Dietrich et al. | |
| 7,137,599 B1 | 11/2006 | Sitzmann et al. | |
| 8,301,411 B2 | 10/2012 | Okayasu | |
| 8,667,206 B2* | 3/2014 | Irizarry | F41G 3/04 710/241 |
| 8,976,503 B2* | 3/2015 | Overbey | F42C 11/002 361/248 |

(Continued)

OTHER PUBLICATIONS

Search Report and Written Opinion dated Dec. 12, 2017 for PCT Application No. PCT/US2017/018841; 15 pages.

*Primary Examiner* — Son Le
*Assistant Examiner* — Akm Zakaria
(74) *Attorney, Agent, or Firm* — Daly, Crowley, Mofford & Durkee

(57) ABSTRACT

Systems and methods for testing an Arm and Fire Device (AFD). The system includes an AFD arm controller and a first power supply coupled to the AFD controller to provide arming power to the AFD controller. The system further includes a monitoring module coupled to the AFD controller through a plurality of means of isolation and communication. The monitoring module may include one or more monitor circuits for the AFD to test at least one circuit in the AFD, at least one circuit external to the AFD, or combination. The system further includes at least one output for the AFD to provide data from the monitoring module. The system may further include a first switch to control the monitoring module is powered and a second switch to control power to the AFD arm module. The system can include an input for applying data to the AFD.

22 Claims, 6 Drawing Sheets

(56) References Cited

U.S. PATENT DOCUMENTS

| | | | | |
|---|---|---|---|---|
| 2001/0045883 A1* | 11/2001 | Holdaway | ............... | H04B 1/04 340/5.51 |
| 2007/0204757 A1* | 9/2007 | Teowee | ............... | F42C 15/188 102/252 |
| 2013/0009483 A1* | 1/2013 | Kawate | ............... | H02J 3/383 307/77 |
| 2014/0043311 A1* | 2/2014 | Shao | ............... | G09G 3/36 345/209 |
| 2014/0067164 A1* | 3/2014 | Papadopoulos | ............... | B64G 1/002 701/3 |
| 2015/0192397 A1* | 7/2015 | DeVries | ............... | F42B 15/36 102/218 |
| 2015/0241190 A1 | 8/2015 | Havran et al. | | |
| 2015/0251616 A1 | 9/2015 | Dobriski et al. | | |
| 2015/0331040 A1* | 11/2015 | Bernon-Enjalbert | ............... | G06F 17/5045 324/750.3 |

* cited by examiner a page image.

SYSTEMS AND METHODS FOR TESTING ARM AND FIRE DEVICES

BACKGROUND

In certain conventional weapon systems, two types of safety include safe separation from a launcher and reliable weapon functioning to protect warfighters near a target, independent of whether the target is coming at a launcher or a weapon is incoming to a target. Safe separation and reliable functioning are facilitated by testing circuitry of such weapon systems prior to use in the field. In the past, government safety allowed arm control circuits of an arm and fire device (AFD) to be tested with launcher power before activating any batteries in a weapon.

Now, government safety may delay when electrical power can be applied to AFD circuits that control arming the device. This requirement limits or inhibits the ways in which the circuitry of the AFD circuits can be tested prior to use in the field (e.g. factory test, pre-deployment test. Pre-deployment includes all time before launch). New AFDs are not allowed to perform electrical tests for weapon integration, all-up-round test, pre-deployment test, service life test, or combinations of these tests. Thus, in some ways, these tougher AFD requirements can reduce a warfighter's safety by preventing a system from destroying or degrading a target due to a failure to detect a missing connection, broken connection, or a broken circuit during a weapon factory test, test before weapon deployment test, or during surveillance test.

SUMMARY

Embodiments of the present disclosure are directed to an AFD that allows for testing connections and circuitry of an AFD system prior to use in the field, before launch, or combination. An AFD system includes an AFD and may include associated circuits in other parts of a weapon. In embodiments, an AFD can include a monitoring module (or other non-arming module) coupled to arm/fire module (like arm control circuits and arm/fire). In an embodiment, the monitoring module can be isolated from the arm/fire module to perform various tests without enabling any circuits in the arm/fire module. This enabling includes power which can operate an arm control circuit or arming circuit. In an embodiment, the arm/fire module can detect signals from the monitoring module after arm power is applied to the AFD. The monitoring module may include various power conditioning, control circuits, monitors, one or more arm environment sensors, and at least one communications circuit. The monitors in the monitoring module can include at least one arm event monitor which is usable by the monitoring module, arm/fire module, or combination. The monitors in the monitoring module can include a monitor for at least one arm environment sensor which is usable by the monitoring module, arm/fire module, or combination. In an embodiment, the monitoring module can be powered separately from any circuit in the arm/fire module and therefore, perform various tests on the circuits and monitors of the AFD prior to use in the field, prior to launch, or combination.

The following provides examples of an AFD: fuze; Electronic Safe and Arm Device (ESAD); Electronic Safe, Arm, and Fire (ESAF); Ignition Safety Device (ISD); Safe and arm device (SAD), and Arm and Fire Device (AFD). An AFD can be in flight termination.

In one aspect, embodiments of the disclosure are directed toward a circuit for an Arm and Fire Device (AFD). The circuit comprises a non-arming control circuit (i.e. S1 & S1 control) and a first power supply coupled to the non-arming control circuit to provide monitoring power to the monitoring module. The circuit further comprises monitoring circuits coupled to the arm control circuit through a plurality of means of isolation (and communications). The monitoring module may include one or more monitoring circuits for the AFD and the monitoring module can be configured to switch a second power supply to the one or more arm control circuits to test at least one of the one or more arm control circuits.

In some embodiments, the one or more monitor circuits include a first environment detector, a second environment sensor, an AFD monitoring module, a built in test and monitor module, a fire detector, and a fire control circuit.

In some embodiments, the plurality of means of isolation includes a first isolation device disposed between the first environment monitor in the monitoring module and a first arm environment detector in the arm/fire module, a second isolation device disposed between the second environment sensor in the monitoring module and a second arm environment detector in the arm/fire module and a third isolation device disposed between the built in test and monitor module in the monitoring module and the Arm/fire module. The first isolation device can be configured to isolate power from the first power supply to the first arm detector in the Arm/fire module. The second isolation device can be configured to isolate the second environment sensor from the second arm environment detector in the arm/fire module. The third isolation device can be configured to isolate the built in test and monitor module from the arm/fire module.

In some embodiments, the AFD can be coupled to a launch device and a first power supply is provided from the launch device to the monitoring module through the first switch. The circuit may include a voltage inversion circuit to generate a continuity signal having a first voltage polarity for performing a continuity test between the AFD and the arm/fire module or the monitoring module. The continuity signal can have a different polarity than an arming signal provided to the AFD.

In some embodiments, the monitoring module includes a circuit which includes one or more voltage steering devices (e.g., diodes, transistors, switches, relays, etc.) to control a path for a continuity signal from the AFD to the arm/fire module or the monitoring module. The monitoring module can be configured to control activation of the second power supply to the arm/fire module responsive to a result of the test of the at least one of the one or more monitor circuits, control circuits, or combination.

In some embodiments, the circuit includes a second switch coupled to a second power supply and a start launch sequence (like release consent) monitor coupled to the second switch. The start launch sequence monitor can be configured to control operation of the second switch responsive to a result of the test of the at least one of the one or more monitor circuits, one or more control circuits, or combination. The circuit may include a high voltage monitor coupled to the AFD monitoring module. The high voltage monitor can be configured to detect a status of a capacitor coupled to a foil initiator in the arm/fire module.

In some embodiments, the AFD includes at least one of a fuze, an Electronic Safe and Arm Device (ESAD), an Electronic Safe, Arm and Fire device (ESAF), an Ignition Safety Device (ISD), an Electronic Ignition Safety Device, and a Safe and Arm Device (SAD).

In another aspect, the present disclosure is directed towards a circuit for an AFD comprising an arm/fire module and a second power supply coupled to the arm/fire module to provide arming power to the arm/fire module. The circuit further comprises a monitoring module coupled to the arm/fire module through a plurality of means of isolation (and communication). The monitoring module may include one or more monitor circuits for the AFD and the monitoring module can be configured to provide a third power supply to the one or more monitor circuits to test at least one of the one or more monitor circuits. The one or more circuits may comprise an intent to launch detector configured to detect the intent to launch command and a power delay module coupled to the intent to launch detector. The power delay module can be configured to delay the second power supply to the arm/fire module until after a launch event. The circuit may include a second switch coupled to an input to the monitoring module. The second switch can be configured to control the second power supply to the one or more arm control circuits.

In some embodiments, the one or more monitor circuits may include an AFD monitoring module, a fire detector and a fire control delay. The plurality of means of isolation may include a first isolation device disposed between the intent to launch detector in the monitoring module and a post launch detector in the arm/fire module, a second isolation device disposed between the power delay module in the monitoring module and a second intent to launch detector in the arm/fire module and a third isolation device disposed between the AFD monitoring module in the monitoring module and the arm/fire module.

In some embodiments, the AFD can be coupled to a launch device and the first power supply is provided from the launch device to the monitoring module through the first switch. The circuit may include a voltage inversion circuit (i.e. third power supply) to generate a continuity signal having a first voltage polarity for performing a continuity test between the AFD and the arm/fire module. The continuity signal may have a different polarity than an arming signal provided to the AFD.

In some embodiments, the monitoring module can be configured to control activation of the second power supply to the arm/fire module responsive to a result of the test of the at least one of the one or more monitor circuits.

In another aspect, the present disclosure is directed towards a method for testing an AFD. The method includes opening one or more means of isolation disposed between an arm/fire module and a monitoring module. The one or more means of isolation can be configured to couple the arm/fire module to the monitoring module in a closed position and isolate the arm/fire module from the monitoring module in an open position. The method further includes providing a continuity signal via a signal path to the monitoring module. The arm/fire module and the monitoring module can be coupled to the signal path and the one or more means of isolation may prevent the continuity signal from powering the arm/fire module. The method further includes verifying a connection to the monitoring module using the continuity signal.

In some embodiments, the method includes generating the continuity signal with a first voltage polarity to performing a continuity test between the AFD and the monitoring module. The method may include providing a power signal to the arm/fire module via the signal path. The power signal can have a second polarity, and the second polarity can be opposite the first polarity.

In some embodiments, the method includes controlling activation of the power signal to the arm/fire module responsive to a result of the continuity test between the AFD and the monitoring module. The method may include isolating a power supply provided to the monitoring module from a first arm detector in the arm/fire module, isolating a second environment sensor in the monitoring module from a second arm environment detector in the arm/fire module and isolating a built in test and monitor module in the monitoring module from the arm/fire module.

In some embodiments, the method includes providing a power supply to the monitoring module via the signal path. The one or more means of isolation may prevent the power supply from powering the arm/fire module. The method may include controlling a direction of the continuity signal along the signal path using one or more voltage steering diodes. In some embodiments, the method includes monitoring a status of a capacitor coupled to a foil initiator in the arm/fire module.

BRIEF DESCRIPTION OF THE DRAWINGS

The foregoing features may be more fully understood from the following description of the drawings in which.

DETAILED DESCRIPTION

Example embodiments of the disclosure provide systems and methods for testing components of an Arm and Fire Device (AFD). The AFD includes a monitoring module that can be electrically isolated from an arm/fire module of the AFD. The monitoring module (or other non-arming module) may include circuits that are powered by communications power (or other non-arming power) and are isolated from circuits in the arm/fire module. The isolation of circuits in the monitoring module from circuits in the arm/fire module may allow for various tests to be performed on the AFD without any significant power to the arm/fire module. In some embodiments, the monitoring module can be configured to monitor inputs and outputs of the arm/fire module.

In some embodiments, the monitoring module can be configured to limit the amount of time power is applied to the monitoring module prior to activation of a battery source (e.g., arming power) to the AFD. The monitoring module may also limit how many of the circuits of the AFD are powered at one time during a specific test.

The monitoring module can include a feedback system to monitor external and internal signals of the AFD, as well as results of various tests performed on the AFD. In some embodiments, the feedback system can prevent activation of the battery source and arm and fire signals to the AFD when inputs to the AFD are incorrect before a launch. In some embodiments, these incorrect inputs can include a release consent absence, an umbilical broken connection, absence of continuity for a rocket motor arm signal to the AFD, absence of continuity of a consent to launch signal, absence of continuity of a rocket motor fire signal to the AFD, an absence of continuity of a second rocket motor fire signal to the AFD, and/or absence of continuity of at least one signal to a fuze AFD. Example signals to a fuze include a continuity signal, fire signal, arm enable signal, or other communications, control, or monitor signal. The feedback system may be configured to prevent detection of an incorrect umbilical disconnect signal during safe jettison and/or an incorrect consent to launch input in response to the incorrect umbilical status detected by the AFD.

Figure 1:
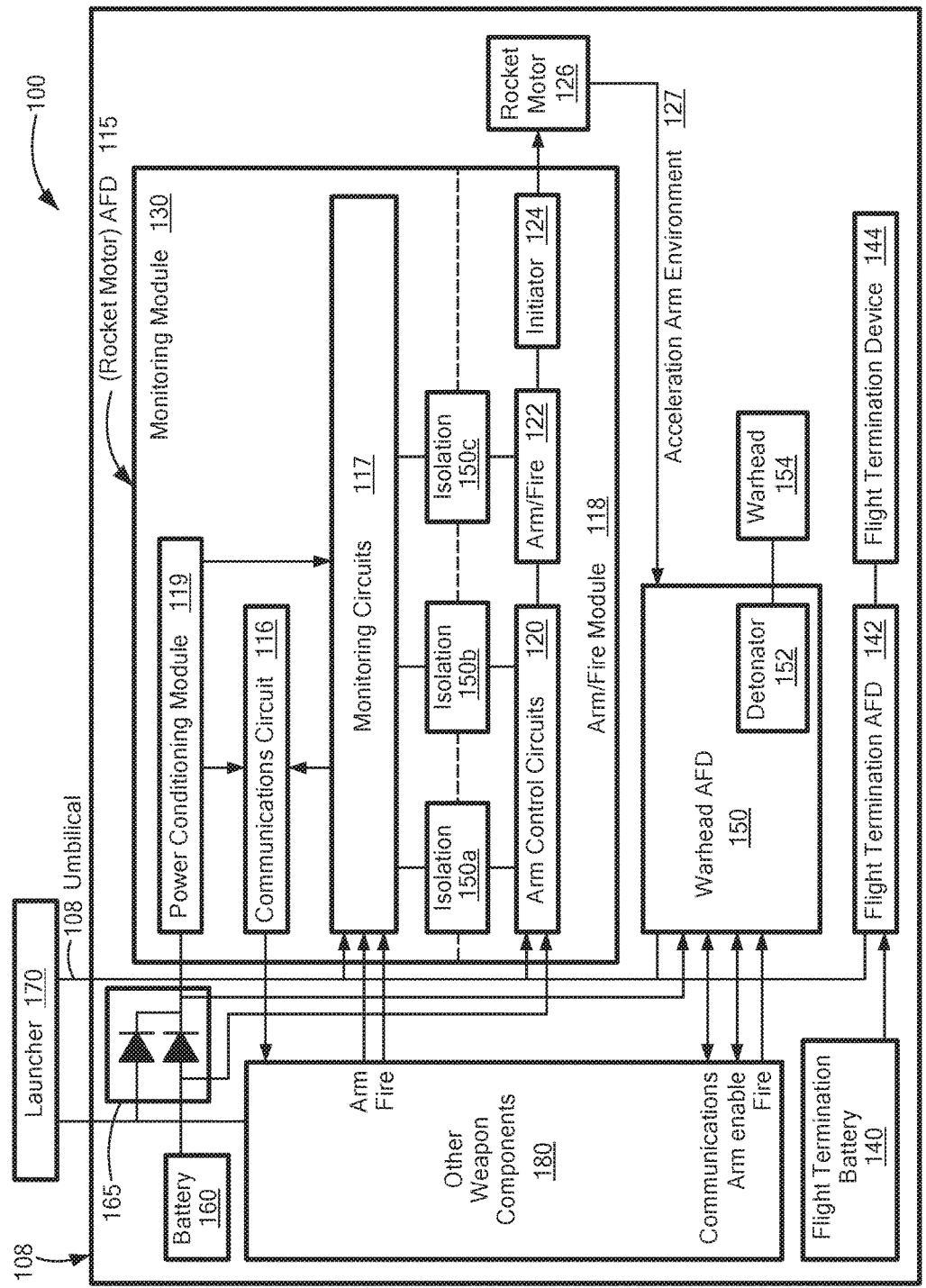
FIG. 1 is a diagram of a weapon system.

Now referring to FIG. 1, a weapon system 100 includes a launcher 170, an umbilical 108, and weapon 105. For example, and without limitation, the weapon system 100 may include missile systems, rocket systems, guided weapons, gun fire systems, freefall weapons, or warhead systems. The weapon 105 includes a battery 160, power interface 165, a rocket motor Arm and Fire Device (AFD) 115, rocket motor 126, a warhead AFD 150, a warhead 154, an acceleration arm environment 127, and other weapon components 180. The weapon 105 may include a flight termination battery 140, flight termination AFD 142, and flight termination device 144. In an embodiment, the weapon system 100 may include a variety of AFDs, i.e. rocket motor AFD 115, warhead AFD 150, flight termination AFD 142, or combination. A weapon 105 may not have all of the components in FIG. 1. The weapon 105 may have more than one warhead AFD 150. The weapon 105 may have more than one rocket motor AFD 115. The rocket motor AFD 115, warhead AFD 150, Flight Termination AFD 142, or combination may include the embodiments of AFD 115 (i.e. arm/fire module 118, monitoring module 130, and means of isolation and communication 150a, 150b, 150c). In an embodiment, the launcher 170 may include various platforms configured to launch the above discussed systems, for example and without limitation, launch pads, mobile launcher platforms, aircraft, ships, or vehicles.

In an embodiment, the circuitry of the AFD 115 can be formed into two portions: a monitoring module 130 and arm/fire module 118. The monitoring module 130 may include a power conditioning module 119, a communications circuit 116, and monitor circuits 117. The power conditioning module 119 may include at least one means of switching power. The means of switching power can restrict powering the monitoring circuits 117 to after start of a launch sequence or other timing. The means of switching power can be external to the AFD. The monitoring module 130 may be communicatively coupled to the other weapons components 180 to receive various communications, at least one arm signal, at least one fire signal, or combination. The communications circuit 116 can be communicatively coupled to the other weapons components 180 to various communications and signals. In some embodiments, the monitor circuits 117 may be coupled to other FIG. 1 components.

The arm/fire module 118 may include an arm control circuit 120, an arm/fire 122, and an initiator 124. In some embodiments, the initiator 124 may be in the arm/fire 122. In some embodiments, the arm/fire 122 may be a component of the arm control circuit 120. The arm/fire 122 may include high voltage circuits. The initiator 124 may be an exploding foil deflagrating initiator or other initiator. The initiator 124 may be directly coupled to a rocket motor 126 or indirectly coupled to a rocket motor by an igniter.

A plurality of means of isolation and communication 150a, 150b, 150c (e.g., isolation devices) may be disposed between the arm/fire module 118 and the monitoring module 130. In an embodiment, the means of isolation and communication 150a, 150b, 150c may couple signals between components of the arm/fire module 118 (e.g. the arm control circuit 120, arm/fire 122, or combination) and components of the monitoring module 130 (e.g. the communications circuit 116, power conditioning module 119, monitoring circuits 117, or combination), simulating a closed position switch. Alternatively, the means of isolation and communication 150a, 150b, 150c may isolate the arm module 118 from the monitoring module 130 and vice versa, simulating an open position switch. Each isolation and communication 150a, 150b, or 150c may be an optic coupler, capacitive coupler, inductive coupler, relay, resistor, semiconductor (i.e. transistor, diode, other), or combination.

In an embodiment, the arm/fire module 118 and the monitoring module 130 may have separate power sources. For example, and as illustrated in FIG. 1, the launcher 170 may provide a first power supply to the monitoring module 130 and the battery 160 may provide a second power source (e.g., arming power) to the arm/fire module 118 and monitoring module 130. Thus, the arm/fire module 118 and the monitoring module 130 may be powered independently from each other. The battery 160 may be coupled to the monitoring module 130 and the arm/fire module 118 through steering circuits like diodes in the power interface 165. The steering circuits may be parts other than diodes or be a combination of diodes and other parts.

In an embodiment, the plurality of means of isolation and communication 150a, 150b, 150c and the independent power sources, allow testing to be performed on the AFD 115 without significantly powering the arm/fire module 118. The launcher 170 may provide power to the monitoring module 130 prior to activation (i.e., turning on) the battery 160. The launcher 170 may provide power to the monitoring module 130 while the monitoring module 130 is isolated (e.g. electrically isolated) from the arm/fire module 118. For example, each of the plurality of means of isolation and communication 150a, 150b, 150c may be equivalently open to isolate the monitoring module 130 from the arm/fire module 118. Thus, the circuitry of the AFD 115 can be tested prior to use in the field (e.g. factory test, pre-deployment test) without significantly powering, providing an arm signal, or combination to the arm/fire module 118.

In some embodiments, the monitoring module 130 is configured to perform the testing. For example, the monitoring module 130 can be configured to perform continuity or other electrical tests for weapon integration, all-up-round test, pre-deployment test, service life test, or combination of them. The monitoring module 130 can be configured to detect a missing connection, broken connection, or a broken circuit in the AFD 115 as part of a weapon factory test, during surveillance test, or test before weapon deployment test. The continuity tests may be performed between the battery 160, the launcher 170 and the AFD 115 without significantly powering the arm/fire module 118.

In some embodiments, the ability to test the circuitry of the AFD 115 may increase the safety of the weapon system 100. For example, the monitoring module 130 can be configured to prevent the activation of the battery 160 in response to a result of one or more of the different tests performed on the AFD 115. For example, in response to a detection of a broken connection or broken circuit element, the monitoring module 130 can prevent the activation of the battery 160 and thus prevent a hang fire weapon with battery power to the AFD 115 (warhead AFD 150 or combination of them). The monitoring module 130 may include a feedback system (e.g. communications circuits 116), as will be discussed in greater detail with respect to FIGS. 2-4.

In some embodiments, the monitoring circuits 117 can be configured to monitor external inputs and outputs of the AFD 115 and the arm/fire module 118 (e.g., arm control circuits 120 and arm/fire 122). The monitoring module 130 may include or be coupled to a built in test and monitor circuit. The built in test and monitor circuit can be configured to test AUR harnesses and connections to the AFD 115 prior to activation of the battery 160. In an embodiment, the plurality of means of isolation and communication 150*a*, 150*b*, 15*c* may be configured to prevent significant powering of the arm/fire module 118 during a test performed by the built in test and monitor circuit.

In some embodiments, the communications circuit 130 may include or be coupled to a voltage inversion circuit. The voltage inversion circuit may be used to perform different continuity tests between the AFD 115 and the battery 160, other weapon components 180, or combination of them. The voltage inversion circuit can be configured to generate a monitoring voltage signal having a different (e.g., opposite) polarity than a voltage polarity of an arm signal, fire signal, or other control signal for the arm/fire module 118. Thus, the monitoring voltage signal having the different polarity can be applied to the AFD 115 without inadvertently providing an arm signal, fire signal, or other control signal to the arm/fire module 118, other weapon components 180, or combination of them.

In some embodiments, the monitoring module 130, battery 160, other weapon components 180, or combination may include one or more voltage steering diodes to create a continuity circuit for arm power, an arm signal, an arm environment (umbilical disconnect, other arm environment), a fire signal, other control signal, or a combination of them. The monitoring module 130 may include a high voltage monitor output. Each of the circuits of the AFD 115 will be described in greater detail below with respect to FIGS. 2-5.

In an embodiment, the weapon 105 may include a warhead AFD 150. The warhead AFD 150 may include the components in the rocket motor AFD 115 as adjusted to control detonation of a warhead. The warhead AFD 150 may include a detonator 152 instead of an initiator 124. The detonator (or exploding foil initiator) may be configured to detonate (trigger) a warhead 154. In some embodiments, the warhead AFD 150 is communicatively coupled to the other weapon components 180 to receive communications and signals, such as arming and fire signals. In some embodiments, the AFD 115 may be coupled to a warhead AFD 150 to a rocket motor 126, e.g., the rocket motor 126 may provide an acceleration arming environment 127 to the warhead AFD 150.

In some embodiments, the weapon 105 may include a flight termination battery 140, flight termination AFD 142 and a flight termination device 144. The flight termination battery 140 may be coupled to the flight termination AFD 142 and the flight termination device 144. In some embodiments, for example in response to a detected missing or broken connection, the flight termination AFD 142 may instruct the flight termination device 142 to cancel or otherwise control a mission. For example, the flight termination battery 140 may provide a third power supply to the flight termination AFD 142 in response to a detected missing or broken connection or any form of issue detected within the weapon 105. The detected missing or broken connection may be internal or external to the weapon 105.

Figure 2:
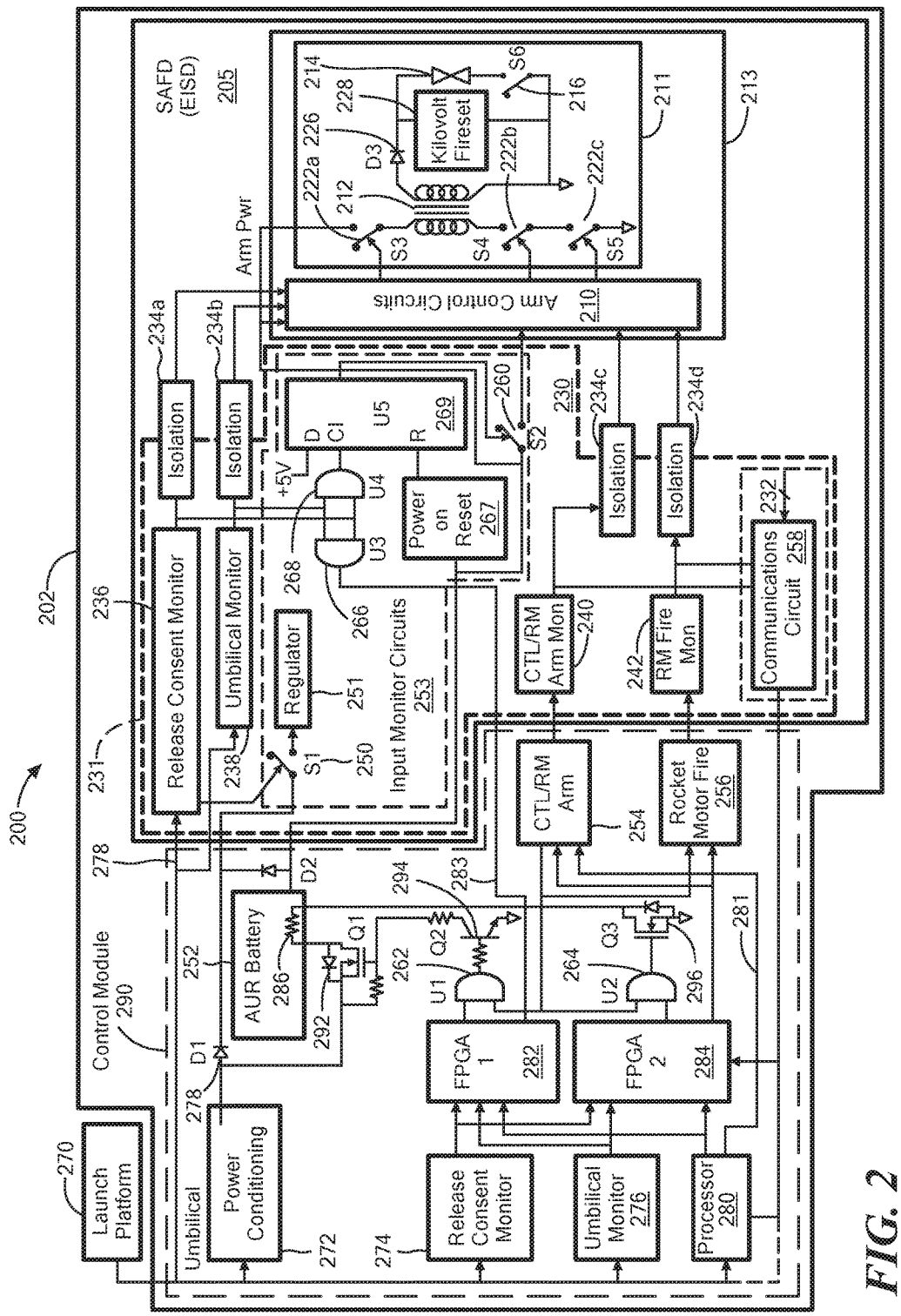
FIG. 2 is a block diagram of a first embodiment of an Arm and Fire Device (AFD) having monitor module coupled to an arm/fire module.

Now referring to FIG. 2, a weapon system 200 includes a weapon 202 coupled to a launch platform 270. The weapon 202 includes a control module 290 and an Arm and Fire Device (AFD) 205. The AFD 205 includes a monitoring module 231 and an arm/fire module 213. The AFD 205 includes means of isolation and communication 234*a*, 234*b*, 234*c*, 234*d* (e.g., isolation devices) for isolating and coupling the monitoring module 231 and arm/fire module 213. The monitoring module 231 includes a power conditioning module 253, monitoring circuits 230, and communications circuits 258. The arm/fire module 213 includes arm control circuits 210 and an arm/fire 211.

The launch platform 270 may be coupled to an input of the weapon 202 through an umbilical connection 278 (e.g., umbilical cable). In some embodiments, the umbilical connection 278 is coupled to the control module 290 and/or the AFD 205. The umbilical connection 278 provides an electrical connection to the weapon 202 and AFD 205 for transmission of signals (e.g., launch command(s), umbilical separation command, etc., or combination) from the launch platform 270 to different components of the weapon 202.

The control module 290 includes a power conditioning 272, a consent monitor 274 (e.g., release consent monitor), an umbilical monitor 276, a processor 280, a first field programmable array (FPGA) 282, a second FPGA 284, a battery 252 (e.g., All Up Round (AUR) battery), a rocket motor (RM) arm module 254 (e.g., rocket motor arm module) and a rocket motor fire module 256 (e.g., rocket motor fire module). The battery 252 includes a squib 286 for activating the battery 252. In an embodiment, the launch platform 270 is coupled to an input of each of the power conditioning 272, the consent monitor 274, the umbilical monitor 276, and the processor 280.

As illustrated in FIG. 2, a first output of the power conditioning 272 is coupled to a power conditioning module 253. The power conditioning module 253 consists of a first switch 250 and regulator 251. Diode 278 may be in the power conditioning module 272. In some embodiments, a diode 278 is disposed on a power path between the power conditioning module 272 and the first switch 250 of the power conditioning module 253 to control a flow of power and prevent inadvertent application of power to the monitoring module 231. A second output of the power conditioning 272 is coupled to an input terminal of a first transistor 292. An output terminal of the first transistor 292 may be coupled to a squib 286 of the battery 252. In an embodiment, the first transistor 292 may be configured to activate the battery 252. For example, in the first transistor 292 may output a signal through its respective output terminal to squib 286 to activate the battery 252.

The consent monitor 274 can have an output coupled to the first FPGA 282 and to the second FPGA 284. In some embodiments, an output of the processor 280 may be a consent to launch (CTL) command 281, like CTL of the CTL/RM Arm signal (consent to launch/rocket motor arm). The output of the consent monitor 274 may be a voltage signal (i.e., voltage from detection of a release consent signal or an optic coupled signal) that is configured to enable power to the monitor circuits 230 (through FPGA 1 282). Thus, the consent monitor 274 may be configured to limit when and how much time power is applied to the monitor circuits 230. This time may start are the beginning of the launch sequence to reduce time for inadvertently powering any circuit in the arm/Fire module 213 with launcher power. The duration of this time can be limited by a timer in the AFD 205 or elsewhere in the weapon 202.

The umbilical monitor 276 can have an output coupled to the first FPGA 282 and to the second FPGA 284. Further, the processor 280 can have an output coupled to the first FPGA 282 and to the second FPGA 284. The output signal from the umbilical monitor 276 may be an umbilical separation/disconnect command e.g., irreversible intent to launch.

Each of the first and second FPGA 282, 284 can have two outputs. A first output of the first FPGA 282 is coupled to a first logic gate (e.g., AND gate) 262 and second output of the first FPGA 282 is coupled to the rocket motor arm module 254. A first output of the second FPGA 284 is coupled to a second logic gate (e.g., AND gate) 264 and a second output of the second FPGA 284 is coupled to the rocket motor fire module 256. In an embodiment, the first output of the first FPGA 282, in conjunction with an output of a third logic gate 266, can be configured to activate (i.e., turn on) the second transistor 294 via the first logic gate 262. The first output of the second FPGA 284, in conjunction with an output of the third logic gate 266, can be configured to activate (i.e., turn on) the third transistor 296 via the second logic gate 264.

In some embodiments, an output of the monitoring module 231 provides feedback 288 for providing the status of an AFD 205. The feedback 288 can be used to increase system reliability by increasing built in test coverage, preventing activating the battery 252, inhibiting ignition of a rocket motor, or other function. The feedback 288 can be to FPGA 2 284, the processor 284, the umbilical 278, or other device.

The first and second logic gates 262, 264 can be coupled together and form (with third logic gate 266 (e.g., AND gate) within the AFD 205 a feedback system to monitor signals transmitted between the launch platform 270, the control module 290 and the monitoring module 231. For example, and as illustrated in FIG. 2, a second input to each of the first and second logic gates 262, 264 is coupled to an output of the third logic gate 266 within the input monitor circuit 230. The output of the first logic gate 262 is coupled to a base terminal of a second transistor 294 (e.g., NPN transistor). A collector terminal of the second transistor 294 is coupled to a gate terminal of the first transistor 292. An emitter terminal of the second transistor is coupled to a reference voltage (e.g., battery ground). The output of the second logic gate 264 is coupled to a gate terminal of a third transistor 296 (e.g., n-channel MOSFET). A drain terminal of the third transistor 296 is coupled to the squib 286 output of the battery 252. A source terminal of the third transistor 296 is coupled to a reference voltage (e.g., ground). It should be appreciated however, that different types of transistors may be used.

Thus, the first, second and third logic gates 262, 264, 266 are coupled together to provide feedback responsive to different conditions within the weapon 202. For example, third logic gate 266 may provide a high output (e.g., 1) or low output (e.g., 0) to the first and second logic gates 262, 264 responsive to detecting an output signal from the consent monitor 236 and the umbilical monitor 238. In turn, the first and second logic gates 262, 264 may provide a high output (e.g., 1) or low output (e.g., 0) to the second and third transistors 294, 296 respectively. The first transistor 292 is coupled to the second transistor 294 and the input of the battery squib 286. The third transistor 296 is coupled to the output of the battery squib 286 and a reference voltage (e.g., battery ground). In an embodiment, the first transistor 292 is configured to power the battery squib 286 to activate the battery 252 and third transistor 296 is configured to provide a return path from the battery squib 286 to a reference voltage (e.g., battery ground). When the squib 286 is powered, the squib 286 may break a barrier in the battery 252 to distribute chemicals in the battery 252 to activate the battery 252.

Now referring to the monitor circuit 230 of FIG. 2, which includes a consent monitor 236 (e.g., release consent monitor), an umbilical monitor 238, a CTL/RM arm monitor 240 (e.g., consent to launch (CTL)/rocket motor (RM) arm monitor), and a RM fire monitor 242 (e.g., rocket motor (RM) fire monitor). In an embodiment, each of the consent monitor 236, umbilical monitor 238, CTL/RM arm monitor 240, and RM fire monitor 242 are configured to monitor inputs from the launch platform 270 and/or the control module 290 to the arm control circuit 210. In an embodiment, the combination of the consent to launch (CTL) 281 through CTL/RM Arm mon 240 and the umbilical monitor 238 in the arm control circuits 210 can increase safety of the AFD 205 by preventing AFD detection of an umbilical disconnect signal when safe jettison occurs without a CTL command 281 from the processor 280 to the AFD 205.

As illustrated in FIG. 2, the umbilical connection 278 from the launch platform 270 is coupled to an input of the consent monitor 236 and to an input of the umbilical monitor 238. The output of the power conditioning module 272 and an output of the battery 252 are coupled to the first switch 250 of the power conditioning module 253. One or more diodes may be disposed on the signal path between the power conditioning module 272, the battery 252 and the first switch 250 to control a flow of signals (e.g., electronic signals, voltage) between them. The first switch 250 is coupled to a voltage regulator 251. The voltage regulator 251 powers the power on reset 267; gates 266, 268; latch circuit 269; monitor circuits 230; and communication circuits 258.

The output of the battery 252 is coupled to an arm power signal path of that is coupled to a third switch 222a of the arm/fire 211. An output of the CTL/RM arm 254 is coupled to an input of the CTL/RM arm monitor 240 and an output of the rocket motor fire module 256 is coupled to an input of the RM fire monitor 242. In some embodiments, a power-on reset 267 is disposed on a signal path between the regulator 251 and a latch circuit 269. The power-on reset 267 can be configured to detect power supplied to the AFD 205. The power-on reset 267 may reset the latch circuit 269 until the power's voltage is adequate to operate the latch circuit 269.

The power conditioning module 253 includes the third logic gate 266. The third logic gate 266 forms a feedback system (with the first and second logic gates 262, 264 in the control module 290). The feedback system can be used to detect and control signals applied to the battery squib 286 and thus control actuation of the battery 252 to control application of arming power to the arm control circuit 210 and arm/fire 211. In an embodiment, the feedback system provides a series of checkpoints before the battery 252 can be activated and arming powering applied to the arm control circuits 210 and arm/fire 211. For example, each of the logic gates 262, 264, 266 may receive a combination of high outputs from different components of the weapon 202 (e.g., consent monitor 274, umbilical monitor 276, processor 280, FPGA 282, 284, consent monitor 236, umbilical monitor 238) to output its own respective high output to control one or more of the two transistors 294, 296.

For example, a first input of the third logic gate 266 is coupled to an output of the consent monitor 236 and a second input of the third logic gate 266 is coupled to an output of the umbilical monitor 238. A first input of the fourth logic gate 268 is coupled to the output of the release consent monitor 236 and a second input of the fourth logic gate 268 is coupled to the output of the umbilical monitor 238. Thus, the third and fourth logic gates 266, 268 can receive a signal from both the release consent monitor 236 and the umbilical monitor 238. In an embodiment, each of the third and fourth logic gates 266, 268 can be configured to detect whether a release consent signal and/or whether an umbilical separation signal has been received.

The third logic gate 266 can provide this information to each of the first and second logic gates 262, 264. The output of the third logic gate 266 is coupled to the second input of both the first and second logic gates 262, 264 to provide a feedback signal. An output of the fourth logic gate 268 is coupled to a second input of a latch circuit 269. A first input of the latch circuit 269 may be coupled to a voltage source (e.g., +5V) like from the regulator 251 and a third input to the latch circuit 269 may be coupled to an output of a power-on reset 267. In an embodiment, the power-on reset 267 can be configured to reset the latch circuit 269 in response to low power supplied to the monitoring circuit 230. An output of the latch circuit 269 may be coupled to a terminal of a second switch 260.

The feedback signal (e.g., 283) may correspond to a signal output of any of the components of the weapon 202 (e.g., of the consent monitor 236, the umbilical monitor 238, etc.). In some embodiments, the feedback signal may indicate consent to launch, an intent to launch signal, or other signal. In other embodiments, the feedback signal may indicate an issue with any of the components of the weapon 202, such as if any connection issues are detected between different components of the AFD 205 (e.g., one or both of the consent monitor 236 and the umbilical monitor 238 having a low (0) output). In still other embodiments, the feedback signal may indicate whether it is ok (e.g., both the consent monitor 236 and the umbilical monitor 238 having a high (1) output) to apply an arming power signal to the arm/fire module 213.

In an embodiment, the monitoring module 231 is disposed between the control module 290 and the arm/fire module 213 to allow monitoring (and detection) of inputs, signals and any form of communications between them. The monitoring module 231 may include components that are isolated from the arm/fire module 213 to allow these elements to be powered up and tested prior to launch without providing significant power to the arm/fire module 213.

To isolate the monitoring module 231 from the arm/fire module 213, the monitoring module 231 may be coupled to the arm/fire module 213 through one or more means of isolation and communication 234a-234d. In some embodiments, each of the components (e.g., circuit monitors, continuity monitors, sensors) of the monitoring module 231 may be coupled to a mating circuit of the arm/fire module 213 through at least one isolation and communication device 234a-234d. In the illustrative embodiment of FIG. 2, the consent monitor 236 (e.g., first circuit monitor) is coupled to a first mating circuit of the arm/fire module 213 through a first isolation device 234a. The umbilical monitor 238 (e.g., second circuit monitor) is coupled to a second mating circuit of the arm/fire module 213 through a second isolation device 234b. The CTL/RM arm monitor 240 (e.g., third circuit monitor) is coupled to a third mating circuit of the arm/fire module 213 through a third isolation device 234c. The RM fire monitor 242 (e.g., fourth circuit monitor) is coupled to a fourth mating circuit of the arm/fire module 213 through a fourth isolation device 234d. An output 232 of the monitoring circuit 230 may also be fed back to the communication circuit 258.

It should be appreciated that although FIG. 2 shows only four means of isolation and communication 234a-234d, any number of means of isolation and communications may be used to isolate and communications couple different portions (e.g., arm/fire module 213 and monitoring module 231) of the AFD 205 based on a particular application.

Still referring to FIG. 2, the arm/fire 211 includes a rocket motor arm and initiation portion that includes a plurality of arm power switches 222a-222c, a transformer 212, a diode 226, a kilovolt fireset 228, and an exploding foil deflagrating initiator (EFDI) 214, and a switch 216.

In operation, the means of isolation and communication 234a-234d are configured to prevent a power supply used to power the monitoring module 231 from significantly powering components of the arm/fire module 213 and allow a signal applied to any of the components of the monitoring module 231 to be transmitted to the arm/fire module 213. The arm/fire module 213 has to be powered with arm power to allow the arm/fire module 213 to detect signals from the monitoring module 231. For example, each of the consent monitor 236, umbilical monitor 238, CTL/RM arm monitor 240 and RM fire monitor 242 may be powered up and tested separately from the arm/fire module 213. Further, test signals may be transmitted between these components to check for continuity without affecting (e.g., significantly powering and/or providing a detectable signal to) the arm/fire module 213. Thus, the means of isolation and communication 234a-234d allow the different monitors and sensors in the monitoring module 231 to be powered separately from arm/fire module 213 and various tests and continuity checks can be performed on them without inadvertently activating the arm/fire module 213. The arm/fire module 213 can have monitoring circuits in addition to those in the monitoring module 231.

In an embodiment, each of the means of isolation 234a-234d may be a circuit made up of various elements to prevent/block a voltage or signal from significantly powering the arm/fire module 213. For example, the means of isolation 234a-234d may include one or more optic couplers, one or more capacitive signal coupling device, one or more capacitive signal coupling device, one or more transistors, one or more diodes, one or more resistors, or any combination of them. The means of isolation 234a-234d may also provide a means of communicating data between the monitoring module 230 and the arm/fire module 213. For example, the means of isolation 234a-234d may provide communication of input data between the monitoring module 230 and the arm/fire module 213. Input data may refer to any of the data, signals and/or communication between a monitoring module 231 and arm/fire module 213 as described herein.

Figure 3:
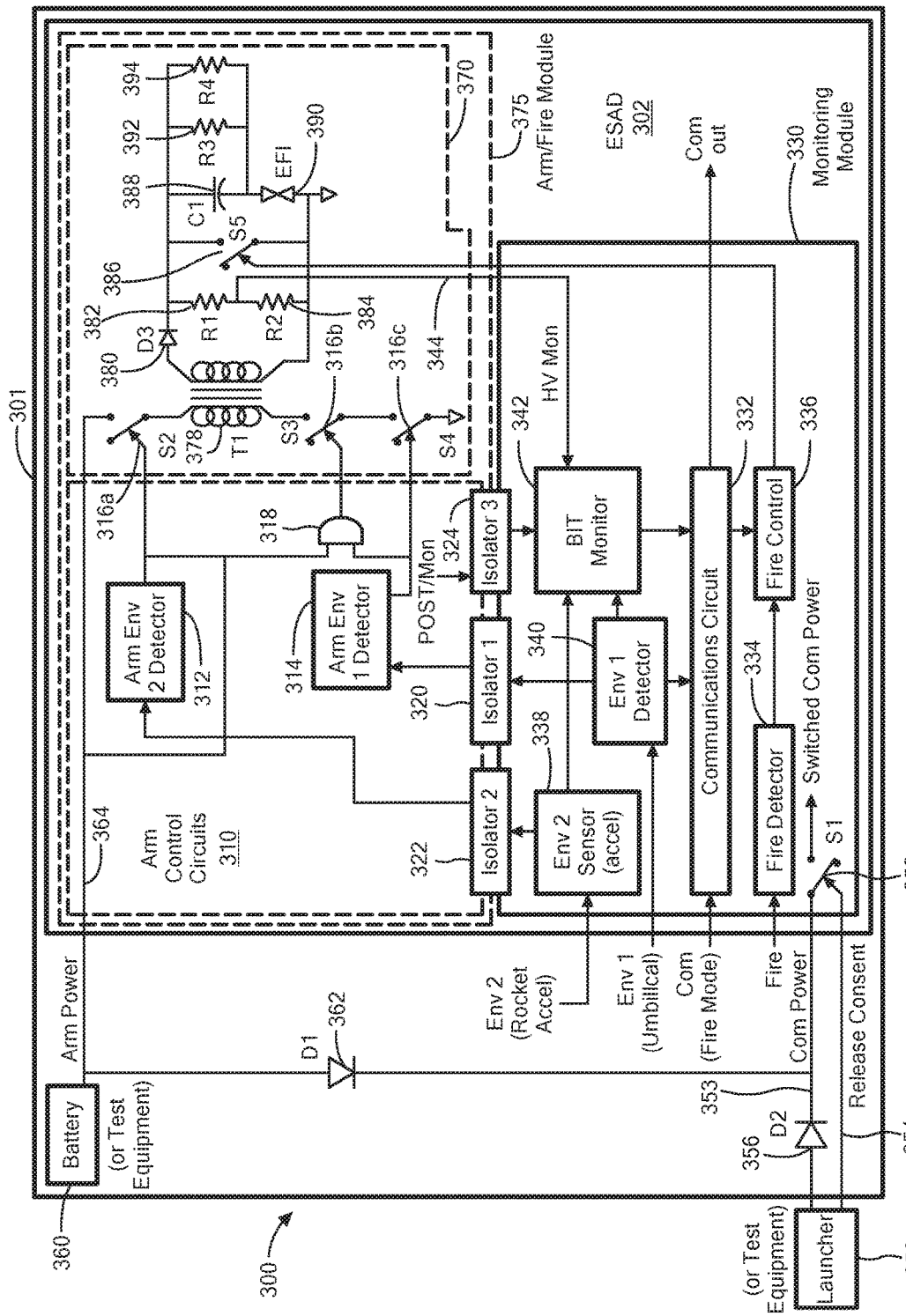
FIG. 3 is a block diagram of a second embodiment of an Arm and Fire Device (AFD) having monitor module coupled to an arm/fire module.

Now referring to FIG. 3, a weapon system 300 includes a launcher 350 and weapon 301. The weapon 301 includes a battery 360; diodes 362, 356; and Electronic Safe and Arm Device (ESAD) 302. The ESAD 302 has a monitoring module 330 and an arm/fire module 375. The arm/fire module 375 includes arm control circuits 310 and an arm/fire 370. Two power sources, a battery 360 power source and a launcher 350 power source, may be coupled to the ESAD 302 to provide separate power sources for the monitoring module 330 and arm/fire module 375. For example, an output of the battery 360 may be coupled to the arm control circuits 310 and the arm/fire 370. An output of the launcher 350 may be coupled to an input of the monitoring module 330 through diode 356.

The launcher 350 may have two outputs and provide a power supply to the monitoring module 330 through a monitor power signal path 353 and a consent signal path 354. In some embodiments, a first switch 352 is disposed on the signal path between the launcher 350 and the monitoring module 330 to control when power is supplied to none, some, or all of the monitoring module 330 and for how long. For example, the first switch 352 may have three terminals, with a first terminal coupled to the mon power path 353, a second terminal coupled to the consent signal path 354 and a third terminal coupled to the input of the monitoring module 330. The first switch 352 may be in the AFD 375 or weapon system 300.

In some embodiments, a first end of the first switch 352 is coupled to the monitor power path 353 (i.e., the first terminal), a second end of the first switch 352 is coupled to the input of the monitoring module 330, and the third end of the first switch 352 is connected to the consent signal 354 which allows the consent signal 354 to control whether or not the first end of the first switch 352 is connected to the second end of the first switch 352. For example, the first switch 352 may be closed when the consent signal 354 is present. The release consent signal 354 may be another signal in the weapon system 300, e.g., a start of launch sequence signal or other signal.

Alternatively, the first switch 352 may be open when the consent signal 354 is absent. In an embodiment, the first switch 352 may close or open in response to a consent signal 354 to supply power to some or all of the monitoring module 330 or a consent signal 354 to disconnect a power supply from the monitoring module 330 respectively.

In some embodiments, a first diode 362 may be positioned in a signal path between the output of the battery 360 and the output of diode 356. A second diode 356 may be disposed on the mon power path 353. The first diode 362 may be used to control the direction of power and/or prevent a power supplied by the launcher 350 from being applied to the arm power signal path 364. The second diode 356 may be used to control direction of power and/or prevent power supplied by the battery 360 from being applied to the launcher 350.

The monitoring module 330 includes an AFD communications circuit 332, a fire detector 334, a fire control circuit 336, a first environment (Env 1) sensor 340, a second environment (Env 2) sensor 338, and a built in test (BIT) and monitor module 342.

The arm control circuits 310 include a first arm environment (Arm Env 1) detector 314, a second arm environment (Arm Env 2) detector 312, and a logic gate 318. To isolate the monitoring module 330 from the arm/fire module 375, the monitoring module 330 may be coupled to the arm/fire module 375 through one or more means of isolation and communication 320, 322, 324. For example, a first isolation device 320 may be disposed between the first environment sensor 340 (e.g., first circuit monitor) in the monitoring module 330 and the first arm environment detector 314 (e.g., first mating circuit) in the arm/fire module 375. A second isolation device 322 may be disposed between the second environment sensor 338 (e.g., second circuit monitor) in the monitoring module 330 and the second arm environment detector 312 (e.g., second mating circuit) in the arm/fire module 375. A third isolation device 324 may be disposed between the built in test and monitor module 342 (e.g., third circuit monitor) in the monitoring module 330 and a third mating circuit of the arm/fire module 375.

In an embodiment, the first isolation device 320 can be configured to isolate (e.g., not power, protect) the first arm detector 314 from the first environment sensor 340, thus preventing significant powering of the arm/fire module 375 with the power intended for the monitoring module 330. The second isolation device 322 can be configured to isolate the second arm environment detector 312 from the second environment sensor 338, thus preventing significant powering of the arm/fire module 375 with the power intended for the second environment sensor 338. The third isolation device 324 is configured to isolate the built in test and monitor 342 from the arm/fire module 375 to prevent any test performed by the built in test and monitor module 342 from significantly powering components of the arm/fire module 375.

As illustrated in FIG. 3, the outputs of each of the first arm detector 314 and the second arm detector 312 may be coupled to an input of the logic gate 318 and to a plurality of arming switches 316a-316c. For example, the output of the first arm environment detector 314 may be coupled to a first input of the logic gate 318 and to a fourth arm switch 316c. The output of the second arm environment detector 312 may be coupled to a second input of the logic gate 318 and to a second arm switch 316a. The output of the logic gate 318 may be coupled to a third arm switch 316b.

In an embodiment, the plurality of arming switches 316a-316c use two arming signals, with second arm switch 316a using a second arming signal from Env 2 sensor 338 and fourth arm switch 316c using a first arming signal from Env 1 sensor 340. The middle or third arm switch 316b can be activated by a sequence of two controls from each of the first arm detector 314 and the second arm detector 312 through the logic gate 318. The closing of each of the plurality of arm switches 316a-316c supplies a voltage to a transformer 378. The voltage generated by the transformer 378 charges capacitor C1 and powers resistors 382, 384, 392, 394 of the arm/fire 370. Env 2 sensor 338 may be an accelerometer for sensing rocket acceleration of the weapon 301. Env 2 sensor 338 may detect an arm environment (e.g., an arm signal from the weapon 301), instead of an arm environment (e.g., rocket motor acceleration). Arm Env 2 detector 312 may control the fourth switch 316c while Arm Env 1 detector may control the second switch 316a.

The arm/fire 370 includes a third diode 380, a plurality of resistive elements 382, 384, 392, 394, a fifth switch 386, a capacitor 388 (e.g., high voltage capacitor), and a detonator (i.e., an exploding foil initiator (EFI)) 390. The first and second resistive elements 382, 384 may be coupled in series. The fifth switch 386 may be coupled in parallel to the first and second resistive elements 382, 384 and the series capacitor 388 and detonator 390. In some embodiments, the fifth switch 386 may be coupled to the fire control module 336 and the fire control module 336 may be configured to operate (e.g., open or close) the fifth switch 386.

The capacitor 388 may be coupled in series with a first end of the EFI 390 and a second end of the EFI 390 may be coupled to a reference voltage (i.e., ground). The third and fourth resistive elements 392, 394 may be coupled in parallel with the capacitor 388 and with each other. The third and fourth resistive elements 392, 394 may be referred to as 'bleeder resistors' and be configured to discharge any electric charge stored in the capacitor 388 when the weapon 301 is unpowered.

In some embodiments, a high voltage monitoring signal path 344 (e.g. high voltage monitor) is coupled to the built in test and monitor module 342 to monitor and indicate a status of a voltage on the capacitor 388 for firing the EFI 390.

In operation, the means of isolation 320, 322, 324 are configured to prevent a power supply used to power the monitoring module 330 from significantly powering components of the arm/fire module 375 and/or prevent a signal applied to any of the components of the communications module 330 from being transmitted to the arm control circuit 310 when arm power 364 is not applied to the arm/fire module 375. For example, each of the AFD communications circuit 332, fire detector 334, fire control circuit 336, first environment sensor 340, second environment sensor 338, and built in test and monitor module 342 may be powered up and tested separately from the arm/fire module 375. In some embodiments, the means of isolation 320, 322, 324 are configured to electrically isolate each of the AFD communications circuit 332, fire detector 334, fire control circuit 336, first environment sensor 340, second environment sensor 338, and built in test and monitor module 342 from the arm control circuit 310. An example function of Env 1 detector 340 is to detect presence of umbilical connector before launch and a first arm environment of umbilical disconnect. An example function of Env 2 sensor is an accelerometer for sensing acceleration of a rocket of the weapons system 300. The means of isolation 234a-234d may also provide a means of communicating data between the monitoring module 330 and the arm/fire module 375.

In an embodiment, each of the means of isolation 320, 322, 324 may be a circuit made up of various elements to prevent/block a voltage or signal from significantly powering any portion of the arm control circuit 310. For example, the means of isolation 320, 322, 324 may include one or more optic couplers, one or more capacitively coupled signal, one or more inductively coupled signals, one or more relays, one or more transistors, one or more diodes, one or more resistors, or any combination of them, to allow continuity checks using signals of varying polarity. Series connection of resistors between a signal and a reference volt (e.g., circuit return) can attenuate a voltage below a level which can operate any portion of the arm control circuit 310. Thus, test signals may be transmitted between these components to check for continuity without affecting the arm/fire module 375.

Figure 4:
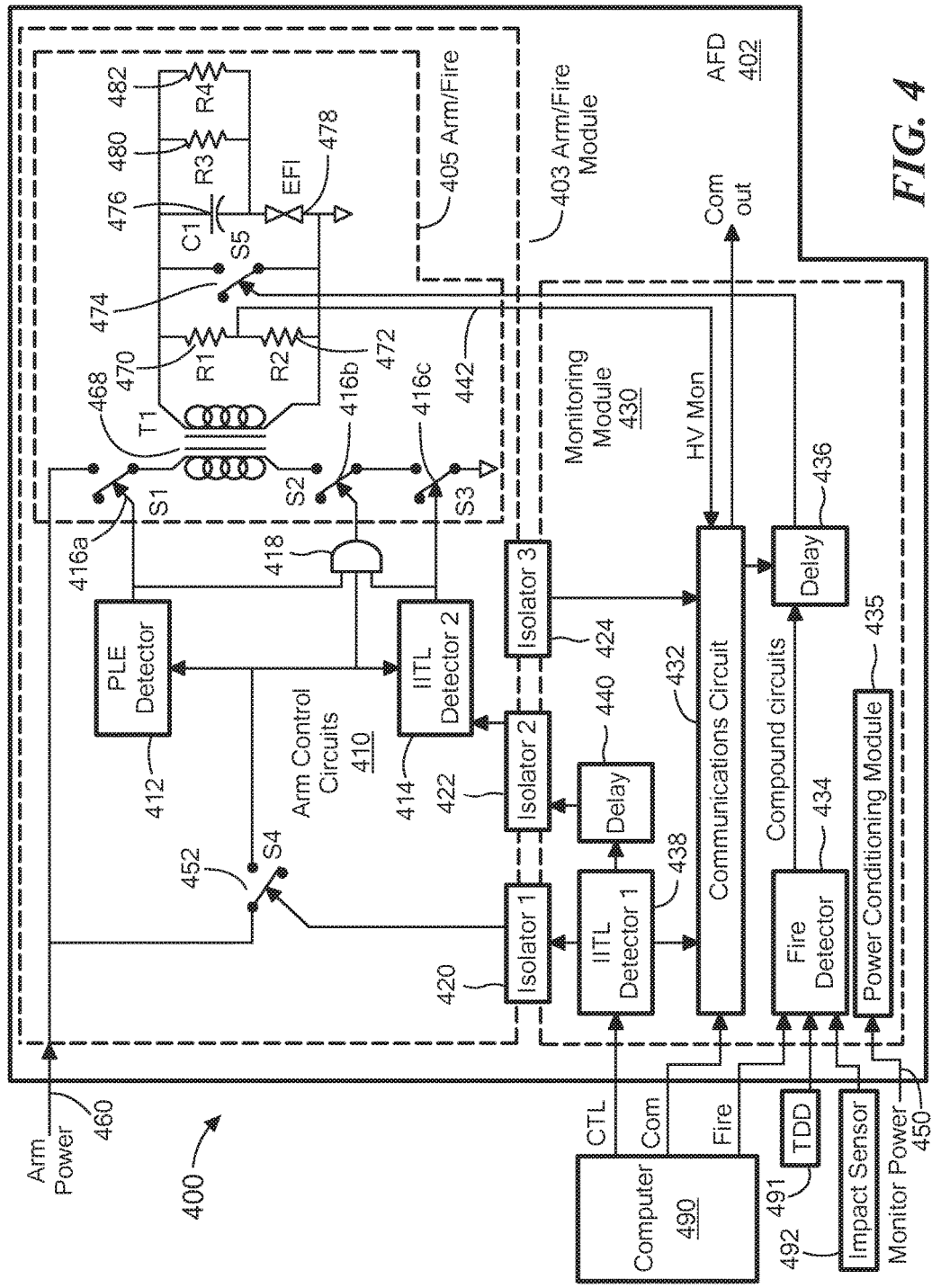
FIG. 4 is a block diagram of a third embodiment of an Arm and Fire Device (AFD) having monitor module coupled to an arm/fire module.

Now referring to FIG. 4, a weapon system 400 includes a computer 490, target detecting device (TDD) 491, impact sensor 492, an AFD 402, and weapon signals 460, 450. The AFD 402 includes a monitoring module 430 and an arm/fire module 403. The arm/fire module 403 includes an arm control circuit 410 and arm/fire 405. In an embodiment, the weapon system 400 may be similar to weapon system 300 described above with respect to FIG. 3, however in weapon system 400, the monitoring module 430 can be configured to detect an irreversible intent to launch command (IITL) and be configured to delay power provided to the arm control circuit 410 of the AFD 402.

Two power sources, an arm power 460 and a monitor power 450, are coupled to the AFD 402. The arm power 460 may be coupled to first switch 452 and the arm/fire 405. The monitor power 450 may be coupled to a power conditioning module 435. In some embodiments, arm power 460 and monitor power 450 may be coupled to a first switch 452. The first switch 452 may be configured to control a flow of power to components in the AFD 402. In an embodiment, the monitoring module 430 and the arm control circuit 410 may have their own power source.

The AFD 402 includes a monitoring module 430, arm control circuit 410, arm/fire 405, EFI 478, and means of isolation and communication 420, 422, 424. The monitoring module 430 includes a power conditioning module 435, a communications circuit 432, a fire detector 434, a fire delay 436, a first irreversible intent to launch (IITL) detector 438, and an irreversible intent to launch (IITL) delay 440. The arm/fire includes a plurality of switches 416a-416c, a transformer 468, a capacitor 476 (e.g., high voltage capacitor), a fifth switch 474, and resistors 470, 472, 480, and 482.

The arm control circuit 410 includes a post launch environment (PLE) detector 412, a second IITL detector (i.e. IITL detector 2) 414, and a logic gate 418. As illustrated in FIG. 4, the outputs of each of the PLE detector 412 and the second IITL detector 414 may be coupled to an input of the logic gate 418 and to a plurality of arm switches 416a-416c. For example, the output of the PLE detector 412 may be coupled to a first input of the logic gate 418 and to a second switch 416a. The output of the second IITL detector 414 may be coupled to a second input of the logic gate 418 and to a fourth switch 416c. The output of the logic gate 418 may be coupled to a third switch 416b.

The plurality of arming switches 416a-416c of the arm/fire 405 are coupled to the arm control circuit 410 and to a transformer 468 of the arm/fire 405. For example, in an embodiment, the plurality of switches 416a-416c may be controlled by two arming environments with the second switch 416a controlled by the second arming environment and the fourth switch 416c controlled by the first arming environment. The middle or third arm switch 416b can be activated by a sequence of two controls from each of the PLE detector 412 and the second IITL detector 414 through the logic gate 418. The closing of each of the plurality of arm switches 416a-416c supplies a voltage to the transformer 468. The voltage generated by the transformer 468 charges capacitor 476 and powers resistors 470, 472, 480, 482. The PLE detector 412 may be controlled by an arm event or signal. The IITL Detector 2 414 may be controlled by an arm event or signal. The PLE detector 412 may control the third switch 416c while the IITL Detector 2 may control the first switch 416a.

The first and second resistive elements 470, 472 may be coupled in series. The fifth switch 474 may be coupled in parallel to the first and second resistive elements 470, 472 and the series capacitor 476 and EFI 478. In some embodiments, the fifth switch 474 may be coupled to the fire delay 436 and the fire delay 436 may be configured to operate (e.g., open or close) the fifth switch 474.

The capacitor 476 may be coupled in series with a first end of the EFI 478 and a second end of the EFI 478 may be coupled to a reference voltage (i.e., ground). The third and fourth resistive elements 480, 482 may be coupled in parallel with the capacitor 476 and with each other. The third and fourth resistive elements 480, 482 may be referred to as 'bleeder resistors' and be configured to discharge any electric charge stored in the capacitor 476 when the weapon 400 is unpowered.

In some embodiments, a high voltage monitoring signal path 442 is coupled to the communications circuit 432. The communications circuit 432 can be configured to monitor and indicate a status of a voltage on the capacitor 476 for firing the EFI 478.

In an embodiment, one or more means of isolation and communication 420, 422, 424 may be disposed between the monitoring circuit 430 and the arm control circuit 410 to isolate the monitoring module 430 from the arm/fire module 403 and vice versa. The one or more means of isolation and communication 420, 422, 424 may be configured to allow for the monitoring module 430 and the arm/fire module 403 to be powered separately without affecting the other. For example, a first isolation device 420 may be disposed between the first IITL detector 438 (e.g., first circuit monitor) and the PLE detector 412 (e.g., first mating circuit). A second isolation device 422 may be disposed between the IITL delay 440 (e.g., second circuit monitor) and the second IITL detector 414 (e.g., second mating circuit). A third isolation device 424 may be disposed between the communications circuit 432 (e.g., third circuit monitor) and the arm control circuit 410 (third mating circuit). Further, the means of isolation and communication 420, 422, 424 can be configured to allow the monitoring module 430 to couple signals to the arm/fire module 403. The means of isolation and communication 420, 422, 424 may allow the monitoring module 430 to monitor the arm/fire module 403.

In an embodiment, the first means of isolation 420 can be configured to isolate the PLE detector 412 from the first IITL detector 438, thus preventing any significant powering of the arm control circuit 410 with the power intended for the monitoring module 430. The second isolation device 422 can be configured to isolate the second IITL detector 414 from the IITL delay 440, thus preventing any significant powering of the arm control circuit 410 with the power intended for the IITL delay 440. The third isolation device 424 is configured to isolate the communications circuit 432 from the arm control circuit 410 to prevent any test performed by the communications circuit 432 from significantly powering any components of the arm control circuit 410.

Figure 5:
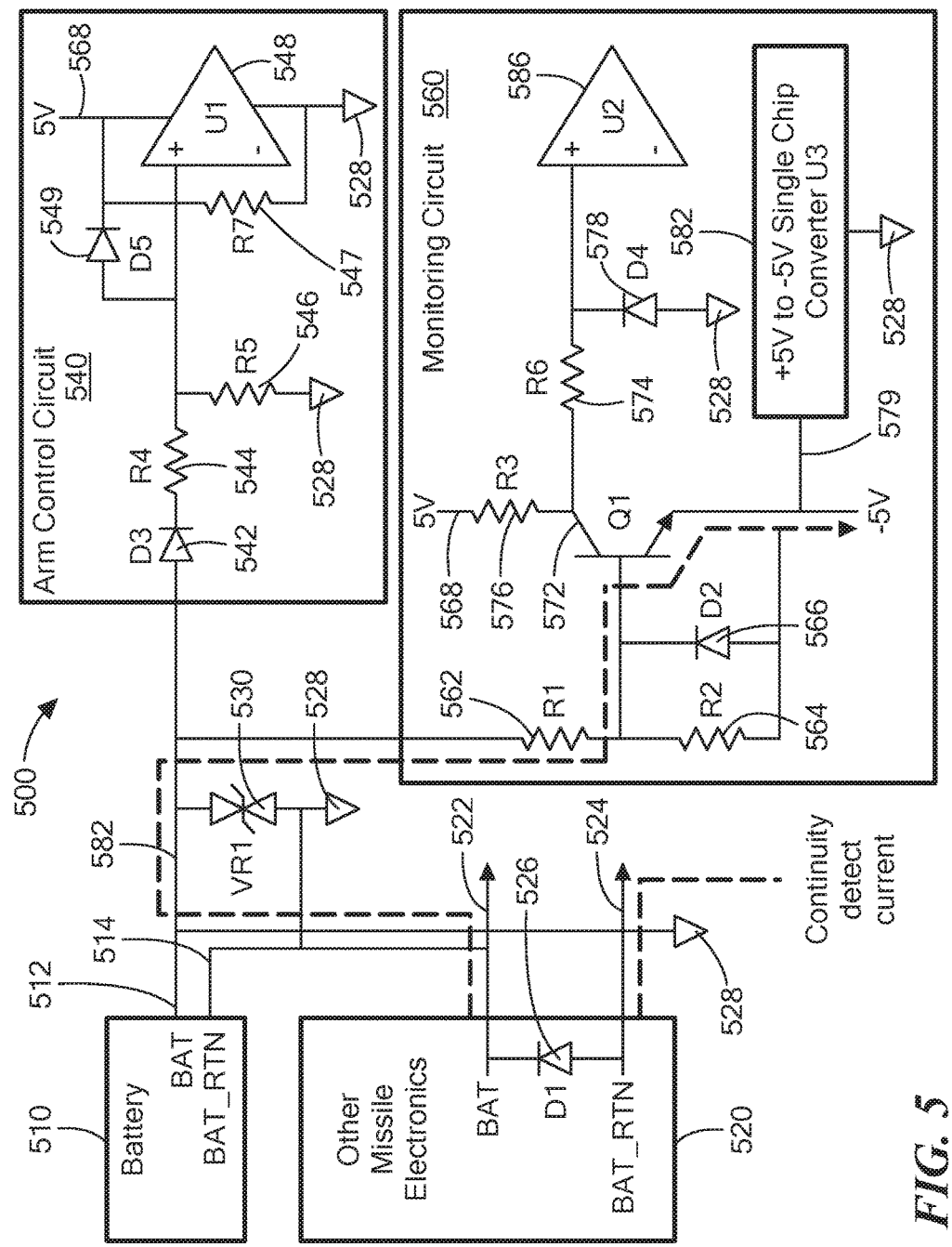
FIG. 5 is a block diagram of a circuit for checking continuity from an Arm and Fire Device (AFD) to an arm power or other circuitry.

Now referring to FIG. 5, a continuity circuit 500 includes a battery module 510, other weapon electronics 520, an arm control circuit 540 and a monitoring circuit 560. In an embodiment, the continuity circuit 500 is configured to perform continuity tests between at least one element in a weapon and circuity in an AFD. It should be appreciated that the continuity circuit 500 is one embodiment and that other circuit designs can be used to isolate an arm control circuit 540 from a monitoring circuit 560 and perform continuity tests between the different elements and circuity in the AFD. The arm control circuit may be a portion of an arm/fire module 118. The monitoring may be a portion of a monitoring module 130 i.e. a non-arming module.

As illustrated in FIG. 5, the battery module 510 has two outputs, a first output 512 and a second output 514. The first output 512 is coupled to an input of the arm control circuit 540 and to an input of the monitoring circuit 560. The second output 514 is coupled to a reference voltage 528 (i.e., ground). In an embodiment, the battery module 510 is configured to provide power (e.g., arming power) to the arm control circuit 540.

The other weapon electronics 520 has two outputs, a first output 522 and a second output 524. The first output 522 is coupled to the input of the arm control circuit 540 and to the input of the monitoring circuit 560. The second output 524 is coupled to the reference voltage 528. A first diode 526 is disposed between the first output 522 and the second output 524 of the other weapon electronics 520. In an embodiment, the first diode 526 may be an input or output protection diode (i.e., electrostatic discharge protection diode in a semiconductor device). In some embodiments, a transorb 530 (i.e., transient-voltage suppression diode) may be positioned between the input to the arm control circuit 540 and the reference voltage 528. The transorb 530 may be used to protect the arm control circuit 540 and/or the monitoring circuit 560 from any voltage spikes during testing or activation of the arming power. For example, the transorb 530 may be used for electrostatic discharge (ESD) protection.

The monitoring circuit 560 includes a plurality of resistive elements 562, 564, 576, 574, a voltage source 568, a second and fourth diode 566, 578, a first transistor 572, a second comparator 586 and a single chip converter 582. In an embodiment, a first end of a first resistive element 562 is coupled to the first output 512 of the battery module 510 and the first output 522 of the weapon electronics module 520. A second end of the first resistive element 562 is coupled to a first end of a second resistive element 564, to a second diode 566 and to an input (i.e., base terminal) of the first transistor 572. In an embodiment, the second resistive element 564 and the second diode 566 are coupled in parallel.

A collector terminal of the transistor 572 is coupled to a second end of a third resistive element 576 and to a first end of a sixth resistive element 574. A first end of the third resistive element 576 is coupled to the voltage source 568. A second end of the sixth resistive element 574 is coupled to the fourth diode 578 and an input to the comparator 586. The fourth diode 578 is coupled to the reference voltage 528 (i.e., ground). An emitter terminal of the transistor 572 is coupled to an input of the single chip converter 582. The single chip converter 582 may be coupled to the reference voltage 528 (i.e., ground). More than one part may be used to provide the voltage conversion for the second voltage source 579. The polarity of the first voltage source 568 and second voltage source 579 may be reverse for some applications. Different magnitudes of the first voltage source 568 and second voltage source 579 may be used for some applications.

The arm control circuit 540 includes third and fifth diodes 542 and 549; a fourth, fifth and seventh resistive elements 544, 546, 547; and a comparator 548. In an embodiment, an input of the third diode 542 is coupled to the first output 512 of the battery module 510 and the first output 522 of other weapon electronics 520. An output of the third diode is coupled to a first end of the fourth resistive element 544. A second end of the fourth resistive element 544 is coupled to a first end of the fifth resistive element 546 and to an input of the comparator 548. A second end of the fifth resistive element 546 is coupled to the reference voltage 528 (i.e., ground). And the comparator 548 is coupled to the reference voltage 528 (i.e., ground). The input of the fifth diode 549 is coupled to the output of the fourth resistor 544 and inputs of the fifth resistor 546 and comparator 548. The power input of comparator 548, the output of the fifth diode 549, and the first end of the seventh resistor 547 are coupled to voltage source 568 and the output of the fifth diode 549. The second end of the seventh resistor is connected to the voltage reference 528.

In operation, the continuity circuit 500 is configured to perform continuity tests between the different elements and circuity in an Arm and Fire Device (AFD) and weapon. For example, and as illustrated in FIG. 5, in one embodiment, a continuity check may be performed between the other weapon electronics 520 and the monitor circuit 560. A continuity signal may be transmitted from the monitor circuit 560 to the other weapon electronics 520 (and through weapon conductors to the battery 510). The first diode 526 may be disposed in the other weapon electronics 520 or near the battery module 510. In an embodiment, by locating the first diode 526 upstream of an output of the battery module 510, the continuity circuit 500 can be configured to check continuity between a weapon system's wiring harnesses and connectors to other weapon circuits besides the battery module 510. Thus, increasing system reliability by increasing percent coverage of weapon electronics checked by a built in test, other test, or combination of these tests.

The continuity signal may have a different (e.g., opposite) polarity with respect to an arming signal used in the AFD. For example, in some embodiments, the continuity signal may have a negative voltage and the arming signal may have a positive voltage. By positioning various circuit elements (e.g., diodes, resistors, etc.), a direction of the continuity signal can be controlled and directed through different circuits in the continuity circuit 500. In an embodiment, an electrical current path may be created using the circuit elements (e.g., diodes, resistors, etc.) that prevents the continuity signal (or any power applied to a monitor circuit 560) from being applied to the logic power module (e.g., arm control circuit 540). Thus, the continuity signal can be applied between other weapon electronics 520 and the monitoring module 130 and not inadvertently activate any portion of the arm/fire module 118 or any arming control circuits within the arm/fire module 118.

For example, to control a flow or direction of the continuity signal, one or more voltage steering diodes may be used in an AFD. In FIG. 5, the third diode 542 is disposed at an input to the arm control circuit 540, with an anode end coupled to the first output 512 of the battery module 510 and the first output 522 of the other weapon electronics 520. The third diode 542 may prevent (e.g., block) a continuity signal with a negative voltage (in contrast an arming signal may have a positive voltage) from affecting or powering components of the arm control circuit 540. In some embodiments, the fourth and fifth resistive elements 544, 546 in the arm control circuit 540 may be arranged as a resistor attenuator to provide further protection against significantly powering any arm control circuitry during a test. To protect against significantly powering any portion of the arm/fire module 118 with power from the monitoring circuit 560, an alternate resistor attenuator may be the series path through resistor 544, diode 549, and resistor 547 to a reference voltage 528 (i.e., ground). The node of diode 549 and resistor 547 is connected to a voltage source 568 and the power pin of the comparator 548. Diode 549 may be in an integrated circuit (i.e., comparator 548). The third diode 542 and the fourth and fifth resistive elements 544, 546 may offer electrostatic discharge (ESD) protection for the comparator 548.

During the continuity test, the continuity signal may be rejected at the third diode 542 of the arm control circuit 540 and received by the first end of the first resistive element 562 of the monitoring circuit 560. The continuity signal may be received by a base terminal of the transistor 572 and flow out of the emitter terminal of the transistor 572. This base emitter current flow turns on transistor 572 which produces a negative voltage at the node of the resistors R3 and R6. A portion of this negative voltage occurs at the resistor 574, diode 578 node due to voltage clamping by diode 578. This negative voltage at the resistor 574, diode 578 node allows comparator 586 to detect continuity between the monitoring circuit 560 in an AFD and both the battery 510 and other weapon electronics 520. In an embodiment, the second diode 566 in the monitoring circuit 560 may provide electrostatic discharge (ESD) protection during such a test.

It should be appreciated that the continuity circuit 500 is just one embodiment and that other circuit designs can be used to isolate an arm control circuit 540 (e.g., arm control circuit of an AFD) and perform continuity tests between the different elements and circuity in the AFD.

Figure 6:
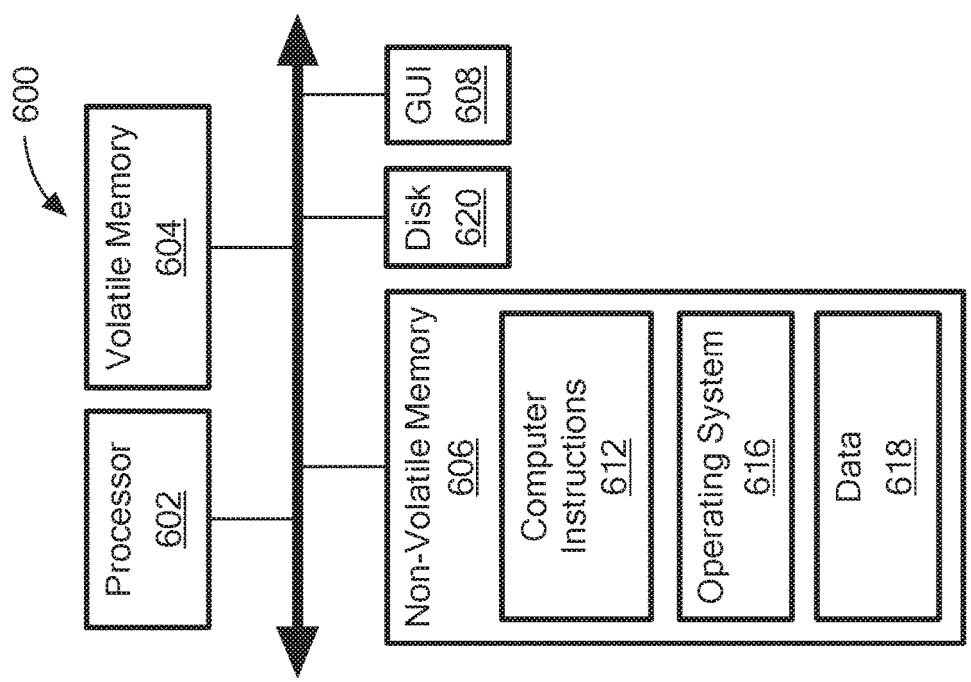
FIG. 6 is a block diagram of an embodiment of a computer system.

Referring to now FIG. 6, a computer 600 may include a processor 602, a volatile memory 604, a non-volatile memory 606 (e.g., read only memory device(s), read or write memory device(s), latch(es), hard disk, or combination), a graphical user interface (GUI) 608 (e.g., a mouse, a keyboard, a display, for example which may be external to the weapon) and a computer disk 620. The non-volatile memory 606 stores computer instructions 612, an operating system 616 and data 618 including data corresponding to results from a continuity or other electrical tests for weapon integration, all-up-round test, pre-deployment test, service life test, or combination of them. In some embodiments, non-volatile memory 606 includes a look-up table that stores and organizes data corresponding to various tests performed on AFDs and between components and circuitry of the AFD. In one example, the computer instructions 612 are executed by the processor 602 out of volatile memory 604 to perform all or part of the method (or process) 700 described below with respect to FIG. 7.

In an embodiment, computer 600 may be the same as or substantially similar to the circuitry described above with respect to FIGS. 1-5. For example, monitoring module 130, monitoring module 230, monitoring module 330, monitoring module 430, or monitor circuit 560 may be the same as or substantially similar to computer 600. Computer 600 may perform all of the same functions and be configured to receive and generate the same data as the monitoring module 130, monitoring module 230, monitoring module 330, monitoring module 430 or monitor circuit 560, as described herein. For example, computer 600 may be configured to perform various tests (e.g., built in tests, continuity tests) on circuits of an AFD or an arm control circuit, such as arm/fire module 118, arm/fire module 213, arm/fire module 375, arm/fire module 403, or arm control circuit 540. The computer 600 may be in the AFD, other part of a weapon, external to the weapon, or combination.

Method 700 is not limited to use with the hardware and software of FIG. 6; they may find applicability in any computing or processing environment and with any type of machine or set of machines that is capable of running a computer program. Method 700 may be implemented in hardware, software, or a combination of the two. Method 700 may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform method 700 and to generate output information.

The system may be implemented, at least in part, via a computer program product, (e.g., in a machine-readable storage device), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., read only memory device(s), read or write memory device(s), latch(es), CD-ROM, hard disk, or magnetic diskette) that is readable by a general or special purpose programmable computer for configuring and operating the computer when the storage medium or device is read by the computer to perform method 700. Method 700 may also be implemented as a machine-readable storage medium, configured with a computer program, where upon execution, instructions in the computer program cause the computer to operate in accordance with method 700.

Method 700 may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Figure 7:
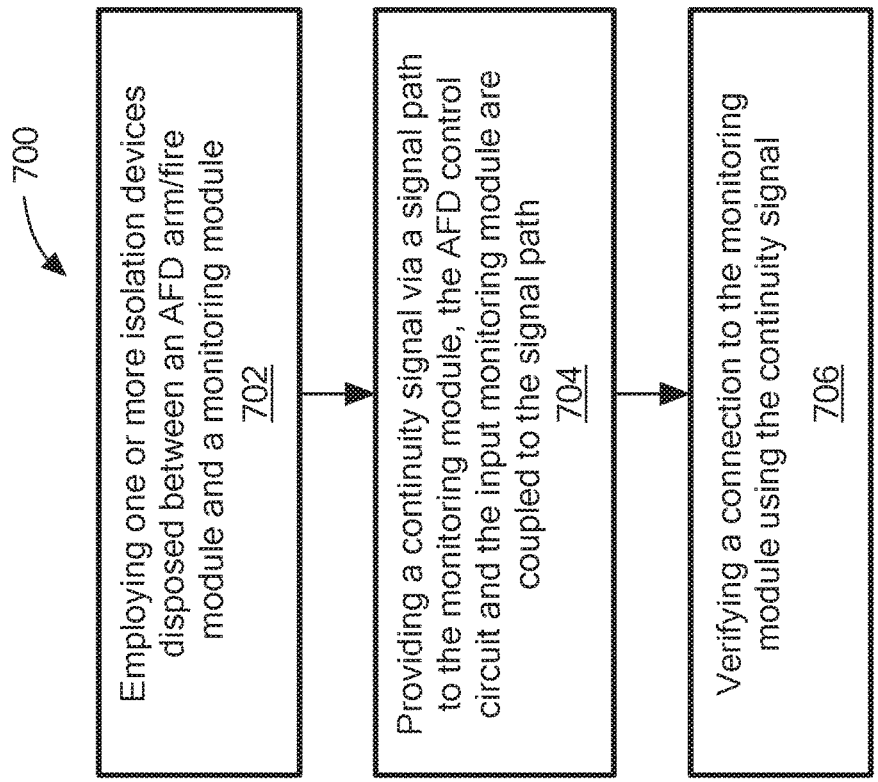
FIG. 7 is a flow diagram of a method for performing a continuity test on an AFD.

Now referring to FIG. 7, a method 700 for testing an Arm and Fire Device (AFD) includes, at block 702, employing one or more means of isolation disposed between AFD arm/fire module (which also includes an arm control circuit and arm/fire) and a monitoring module (which also includes referred to herein as a monitoring circuits, communications circuit, a monitoring circuit, and a communication). The one or more means of isolation can be configured to couple the AFD arm/fire module to the monitoring module in a closed position and isolate the AFD arm/fire module from the monitoring module in an open position. At block 704, a continuity signal may be provided via a signal path to the monitoring module. In an embodiment, the AFD arm/fire module and the monitoring module can be coupled to the signal path. In an embodiment, the one or more means of isolation may be configured to prevent the continuity signal from powering the AFD arm/fire module. At block 706, a connection to the monitoring module can be verified using the continuity signal.

In an embodiment, an AFD may include an AFD arm/fire module and a monitoring module. The AFD arm/fire module may include various arming circuitry for arming and activating a weapon system (e.g., warhead). The AFD arm/fire module may include various arming circuitry for arming and activating a rocket motor. The AFD arm/fire module may include various arming circuitry for arming and activating a flight termination system. In some embodiments, due to government restrictions on testing protocol, the AFD arm/fire module cannot be powered prior to a use in the field (e.g., firing of a missile in combat). In order to test the AFD in line with the government regulations, a separate power system can be supplied to the monitoring module from the Arm/fire module. Further, the monitoring module can be isolated from the AFD arm/fire module through one or more means of isolation.

At block 702, one or more means of isolation disposed between the AFD arm/fire module and the monitoring module may be employed to isolate the AFD arm/fire module from the monitoring circuit and vice versa. In an embodiment, the one or more means of isolation can be configured to couple the AFD arm/fire module to the monitoring module in a closed position and isolate the AFD arm/fire module from the monitoring module in an open position.

In an embodiment, the one or more means of isolation can isolate components of the monitoring module from the AFD arm/fire module. For example, a first device may be disposed between a first environment sensor in the monitoring module and a first arm environment detector in the Arm/fire module. A second isolation device may be disposed between a second environment sensor in the monitoring module and a second arm environment detector in the AFD arm/fire module. A third isolation device may be disposed between a built in test and monitor module in the monitoring module and the AFD arm/fire module. The first isolation device can be configured to isolate a power supply provided to the monitoring module from the first arm detector in the AFD arm/fire module. The second isolation device can be configured to isolate the second environment sensor from the second arm environment detector the arm/fire module. The third isolation device can be configured to isolate the built in test and monitor module from the AFD arm/fire module.

In other embodiments, a first isolation device may be disposed between an intent to launch detector in the monitoring module and a post launch detector in the AFD arm/fire module. A second isolation device may be disposed between a power delay module in the monitoring module and a second intent to launch detector in the AFD arm/fire module. A third isolation device may be disposed between an AFD monitoring module and the AFD arm/fire module. The AFD may include any number of means of isolation based on a number of connections to an AFD arm/fire module and/or a number of desired monitoring circuits for the AFD.

The isolation of the monitoring module from the arm/fire module can allow for monitoring of external inputs and outputs of the AFD arm/fire module. For example, the monitoring module (or other non-arming power module) can power circuitry within the AFD independently from the AFD arm/fire module. In an embodiment, prior to providing power the circuitry of the AFD, the one or more means of isolation may be opened to isolate the AFD arm/fire module from other circuitry in the AFD. Thus, the other circuitry in the AFD can be tested without accidently powering the AFD arm/fire module. For example, testing may be performed such as continuity or other electrical tests for weapon integration, all-up-round test, pre-deployment test, service life test, or combination of them without affecting the AFD arm/fire module.

At block 704, a continuity signal can be provided via a signal path to the monitoring module. In an embodiment, both the AFD arm/fire module and the monitoring module may be coupled to the signal path. The one or more means of isolation may be opened before the continuity signal is provided to the monitoring module to isolate the AFD arm/fire module. Thus, during testing of components of the monitoring module, the one or more means of isolation may prevent the continuity signal from reaching (e.g., powering) the AFD arm/fire module.

In some embodiments, a voltage inversion circuit may be used to perform different continuity tests between different circuit elements in the AFD. For example, the voltage inversion circuit can generate the continuity signal (or monitoring voltage signal) having a different (e.g., opposite) polarity than the voltage polarity for arm power to the AFD. Thus, the continuity signal having the different polarity can be applied to the AFD without inadvertently providing an arming signal to the AFD.

For example, in some embodiments, the continuity signal may be generated with a first voltage polarity to perform a continuity test between the AFD and the monitoring module. Each of the means of isolation may be a circuit made up of various elements to prevent/block a voltage or signal from affecting the AFD arm/fire module based on the signal's polarity. The means of isolation may include one or more optic couplers, one or more relays, one or more capacitive couplers, one or more transistors, one or more diodes, one or more resistors (e.g., resistor attenuator), or any combination of them. Thus, in some embodiments, a signal having a negative polarity (e.g., negative voltage) may be prevented/blocked from affecting the AFD arm/fire module by the means of isolation. In some embodiments, voltage steering diodes and/or or resistor attenuator circuits may be disposed at one or more inputs to the AFD arm/fire module to provide further protection and isolation capabilities. The voltage steering diodes may be used to control a direction of the continuity signal along the signal path.

In some embodiments, a voltage steering diode may be used to create a continuity circuit for arm power or an arm environment (umbilical disconnect, other arm environment), or a combination of them. The monitoring module may include circuits to monitor the circuits in the AFD arm/fire module, such a high voltage monitor output (i.e. high voltage monitor). For example, the monitoring module may be configured to monitor a status of a capacitor coupled to a foil initiator in the AFD arm/fire module.

In some embodiments, a power supply is coupled to the monitoring module via the signal path. The means of isolation may prevent the power supply from powering the AFD arm/fire module. In other embodiments, the power supply may be coupled to the monitoring module independently from the AFD arm/fire module.

At block 706, a connection to the monitoring module can be verified using the continuity signal. In some embodiments, the monitoring module may be configured to control activation of a power signal (e.g., arming signal, arming power, other power, or other signal) to the AFD arm/fire module responsive to a result of the continuity test between the AFD and the monitoring module. For example, the continuity signal may be used as part of a continuity test between different components of the AFD. The continuity test may detect a missing connection, broken connection, or a broken circuit within the AFD, external to the AFD, or combination. Responsive to these results, the monitoring module may prevent the power signal from powering the AFD arm/fire module.

In some embodiments, the AFD may include a feedback system to relay the results of the different tests to different components and may ensure an arming signal is not issued (e.g., actively block/prevent) to the AFD arm/fire module after a broken connection or circuit is detected. For example, AFD may provide RS485, RS422 or other communication signal(s) for providing the results of the AFD continuity tests, other circuit tests, or combination to a test port on a weapon, through a weapon processor to a test port on a weapon, or combination. The communication signals may be provided by the monitoring module 130, communication circuits 258, communication circuits 332, communication circuits 432, or other communication circuits in the AFD. Another example is an AFD may include a feedback system having a plurality of logic gates with some disposed within the AFD arm/fire module and others disposed within the monitoring module. The inputs and outputs of the logic gates may be coupled to each other as well as to inputs and outputs of different monitoring systems (e.g., release consent monitor, umbilical monitor).

The feedback system can be used to detect and control signals applied to a battery (or any power source) that supplies arming power to the AFD arm/fire module. In an embodiment, the feedback system can provide a series of checkpoints in which an appropriate signal (e.g., high output 1) must be received from a preceding monitor or logic gate in order for the subsequent logic gate to issue an OK to launch, fire signal. Thus, before the battery can be activated and supply arming powering to the AFD arm/fire module, each of the logic gates in the feedback system can be configured to verify the outputs of the various monitors in the AFD. For example, each of the plurality of logic gates may receive a combination of high outputs from different components of the AFD (e.g., consent monitor, umbilical monitor, a processor) to output its own respective high output to another or subsequent logic gate in the feedback system.

In some embodiments, the logic gates may be configured to detect whether a consent to launch signal or fire signal has been received and/or whether an umbilical separation signal has been received. The logic gates can provide this information to an input of another logic gate in the feedback system.

It is understood that logic gate should be construed to include any practical implementation in hardware and software in any suitable circuit including discrete circuits, analog and/or digital devices, field programmable gate array (FPGA), and the like.

The feedback system can be configured to generate a feedback signal. In some embodiments, the feedback signal may correspond to a signal output of any of the components of the AFD. The feedback signal may indicate an intent to launch command, an irreversible intent to launch command, or other condition(s). In other embodiments, the feedback signal may indicate an issue with any of the components of the AFD, such as if any connection issues are detected between different components of the AFD. In still other embodiments, the feedback signal may indicate whether it is ok to apply an arming power signal to the arm/fire module 210. The feedback signal may be provided to or generated by the monitoring module.

In some embodiments, responsive to a valid test and/or valid feedback signal in which no issues are detected, the monitoring module may allow the power signal to power and arm the AFD arm/fire module. Thus, the power signal (e.g., arming signal arming power) may be provided to the AFD arm/fire module via the signal path. The power signal may have an opposite polarity of the continuity signal.

A number of embodiments of the disclosure have been described. Nevertheless, it will be understood that various modifications may be made without departing from the spirit and scope of the disclosure. For example, the type of transistors, use of a transistor or comparator, type of logic, organization of resistor(s), diode(s), or other electronic parts, voltages, and grounding may be by varied using both the ground plane height and the width of the center conductor line.

Elements of different embodiments described herein may be combined to form other embodiments not specifically set forth above. Other embodiments not specifically described herein are also within the scope of the following claims.

What is claimed:

1. A system comprising:
   an arm and fire device (AFD) arm/fire module having arm control circuits and an arm/fire circuit, wherein the arm control circuits are coupled to the arm/fire circuit through one or more arming switches;
   a monitoring module coupled to the AFD arm/fire module through a plurality of means of isolation, wherein the monitoring module is powered by a first power supply, the monitoring module includes one or more circuit monitors for monitoring continuity of a first signal path to the arm control circuits in the AFD arm/fire module and for monitoring a status of at least one of the arm control circuits in the AFD arm/fire module, and wherein the monitoring module includes a first switch for controlling power from the first power supply to the one or more circuit monitors in the monitoring module; and
   a second power supply coupled to the AFD arm/fire module to provide arming power to the AFD arm/fire module, wherein the first power supply is coupled to a second signal path between the second power supply and the AFD arm/fire module through one or more voltage steering devices, and wherein the one or more voltage steering devices are configured to control a flow of power between the first power supply and the second power supply and the AFD arm/fire module.

2. The system of claim 1, wherein the plurality of means of isolation comprise:
a first means of isolation disposed between a first circuit monitor in the monitoring module and a first mating circuit in the AFD arm/fire module; and
a second means of isolation disposed between a second circuit monitor in the monitoring module and a second mating circuit in the AFD arm/fire module.

3. The system of claim 2, wherein:
the first means of isolation is configured to isolate the first circuit monitor from the first mating circuit in the AFD arm/fire module; and
the second means of isolation is configured to isolate the second circuit monitor from the second mating circuit in the AFD arm/fire module.

4. The system of claim 2, wherein:
the first means of isolation is configured to provide communication of input data to the first mating circuit in the AFD arm/fire module; and
the second means of isolation is configured to provide communication of input data to the second mating circuit in the AFD arm/fire module.

5. The system of claim 1, wherein the monitoring module is coupled to an external circuit and the first power supply is provided from the external circuit to the monitoring module through the first switch.

6. The system of claim 5, wherein the first switch controls application of the first power supply to at least one of the one or more circuit monitors in the monitoring module.

7. The system of claim 1, further comprising a voltage inversion circuit to generate a continuity signal having a voltage polarity different from the polarity of a control signal to the AFD arm/fire module.

8. The system of claim 5, wherein the one or more voltage steering devices are configured to provide at least one path for measuring continuity to at least one external circuit to at least one of the arm control circuits in the AFD arm/fire module and prevent a continuity signal from activating the at least one of the arm control circuits.

9. The system of claim 1, wherein the monitoring module is configured to control activation of the second power supply to the AFD arm/fire module as a result of a first test of continuity of the first signal path to the arm control circuits, a second test of a status of at least one of the arm control circuits, or combination of both.

10. The system of claim 1, further comprising a second switch coupled to the second power supply and a start launch sequence monitor coupled to the second switch, wherein the start launch sequence monitor is configured to control operation of the second switch responsive to a result of a test of at least one of the one or more circuit monitors.

11. The system of claim 1, further comprising a high voltage monitor coupled to at least one of the one or more circuit monitors, wherein the high voltage monitor is configured to detect a status of a capacitor coupled to an initiator in the AFD arm/fire module.

12. The system of claim 1, wherein the AFD arm/fire module includes at least one of a fuze, an Electronic Safe and Arm Device (ESAD), an Electronic Safe, Arm and Fire device (ESAF), an Ignition Safety Device (ISD), and a Safe and Arm Device (SAD).

13. The system of claim 1, wherein the one or more circuit monitors comprises:

an intent to launch detector configured to detect an intent to launch condition; and
a power delay module coupled to the intent to launch detector, wherein the power delay module is configured to delay the first power supply to the AFD arm/fire module until after a launch event; and
an intent to launch control switch coupled to an input to the monitoring module, wherein the intent to launch control switch is configured to control application of the second power supply to the arm control circuits.

14. The system of claim 12, wherein the plurality of means of isolation and communication comprises:
a third means of isolation disposed between the intent to launch detector in the monitoring module and a post launch detector in the AFD arm/fire module; and
a fourth means of isolation disposed between the power delay module in the monitoring module and a second intent to launch detector in the AFD arm/fire module.

15. A method for testing an Arm and Fire Device (AFD), the method comprising:
employing one or more means of isolation disposed between an AFD arm/fire module and a monitoring module, wherein the monitoring module is coupled to a first power supply and the AFD arm/fire module is coupled to a second power supply, wherein the one or more means of isolation are configured to couple arm control circuits in the AFD arm/fire module to the monitoring module in a closed position and isolate the arm control circuits in the AFD arm/fire module from the monitoring module in an open position;
controlling a flow of power between the first power supply and the second power supply and the AFD arm/fire module through one or more voltage steering devices, wherein the first power supply is coupled to a second signal path between the second power supply and the AFD arm/fire module through the one or more voltage steering devices;
providing a continuity signal via a first signal path to the monitoring module responsive to employing the one or more means of isolation, wherein the arm control circuits in the AFD arm/fire module and the monitoring module are coupled to the first signal path, and wherein the one or more means of isolation prevents the continuity signal from powering the arm control circuits in the AFD arm/fire module; and
verifying a connection to the monitoring module using the continuity signal.

16. The method of claim 15, further comprising generating the continuity signal with a first voltage polarity, and performing a continuity test between the monitoring module and an external circuit to the AFD arm/fire module.

17. The method of claim 16, further comprising providing a power signal to the external circuit via the first signal path, wherein the power signal has a second voltage polarity, and wherein the second voltage polarity is opposite the first voltage polarity.

18. The method of claim 17, further comprising controlling activation of the power signal to the AFD arm/fire module responsive to a result of the continuity test between the monitoring module and the external circuit to the AFD arm/fire module, an input to the AFD arm/fire module, or combination of them.

19. The method of claim 15, wherein employing the one or more means of isolation further comprises:
isolating the first power supply provided to the monitoring module from a first arm detector in the AFD arm/fire module;

isolating a second environment sensor in the monitoring module from a second arm environment detector in the AFD arm/fire module; and isolating a built in test and monitor module in the monitoring module from the AFD arm/fire module.

20. The method of claim 15, further comprising providing the first power supply to the monitoring module via the first signal path responsive to opening the one or more means of isolation, wherein the one or more means of isolation prevents the first power supply from powering the AFD arm/fire module.

21. The method of claim 15, further comprising controlling a direction of the continuity signal along the first signal path using the one or more voltage steering devices.

22. The method of claim 15, further comprising monitoring a status of a capacitor coupled to a foil initiator in the AFD arm/fire module.

* * * * *